(12) United States Patent
Chaoui

(10) Patent No.: US 7,737,754 B2
(45) Date of Patent: Jun. 15, 2010

(54) METHOD OF FORMING A SIGNAL LEVEL TRANSLATOR AND STRUCTURE THEREFOR

(75) Inventor: Hassan Chaoui, Toulouse (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 11/574,559

(22) PCT Filed: Apr. 17, 2006

(86) PCT No.: PCT/US2006/014297

§ 371 (c)(1),
(2), (4) Date: Mar. 1, 2007

(87) PCT Pub. No.: WO2007/120130

PCT Pub. Date: Oct. 25, 2007

(65) Prior Publication Data

US 2009/0102537 A1    Apr. 23, 2009

(51) Int. Cl.
*H03L 5/00* (2006.01)
(52) U.S. Cl. .................. 327/333; 327/427; 326/68; 326/81
(58) Field of Classification Search .............. 327/333, 327/427; 326/68, 80, 81; 365/189.11
See application file for complete search history.

(56) References Cited

U.S. PATENT DOCUMENTS 6,288,591 B1 * 9/2001 Riccio .................. 327/333

* cited by examiner

*Primary Examiner*—Long Nguyen
(74) *Attorney, Agent, or Firm*—Robert F. Hightower

(57) ABSTRACT

In one embodiment, a first portion (20) of translator circuit (17) is configured to extract a first supply voltage level from a high level of an input signal, an inverter (25) is configured to operate from the first supply-voltage level and a second portion (30) of the translator circuit is configured to operate from a second supply voltage level (V2) that is greater than the first supply voltage level.

15 Claims, 3 Drawing Sheets

METHOD OF FORMING A SIGNAL LEVEL TRANSLATOR AND STRUCTURE THEREFOR

BACKGROUND OF THE INVENTION

The present invention relates, in general, to electronics, and more particularly, to methods of forming semiconductor devices and structures.

In the past, the semiconductor industry utilized various methods and structures to produce level shifter circuits that shifted the logic levels of a digital signal from one set of voltage values to a different set of voltage values. These level shifter circuits had various applications such as in circuits that communicated among one another with a serial communication protocol. In such applications, the communication signal may be transmitted from a circuit that operated between one set of voltage levels and may be received by circuit that operated between a different set of voltage levels. Some of the prior level shifter circuits required dual power supplies in order to translate the incoming signal to the voltage level of the receiving circuit. Using dual power supplies usually increased the cost of the circuits.

Other level shifter circuits sank current from the input signal which could have degraded the input signal and resulted in errors in the received signal. Some other level shifters consumed dc current which caused power dissipation during periods when most of the circuit was not switching, such as during a standby operating mode.

Accordingly, it is desirable to have a method of forming a level shifter circuit that minimizes the amount of current sunk from the input signal, that does not require dual power supplies, that minimizes power dissipation, and that reduces the cost of the level shifter circuit.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
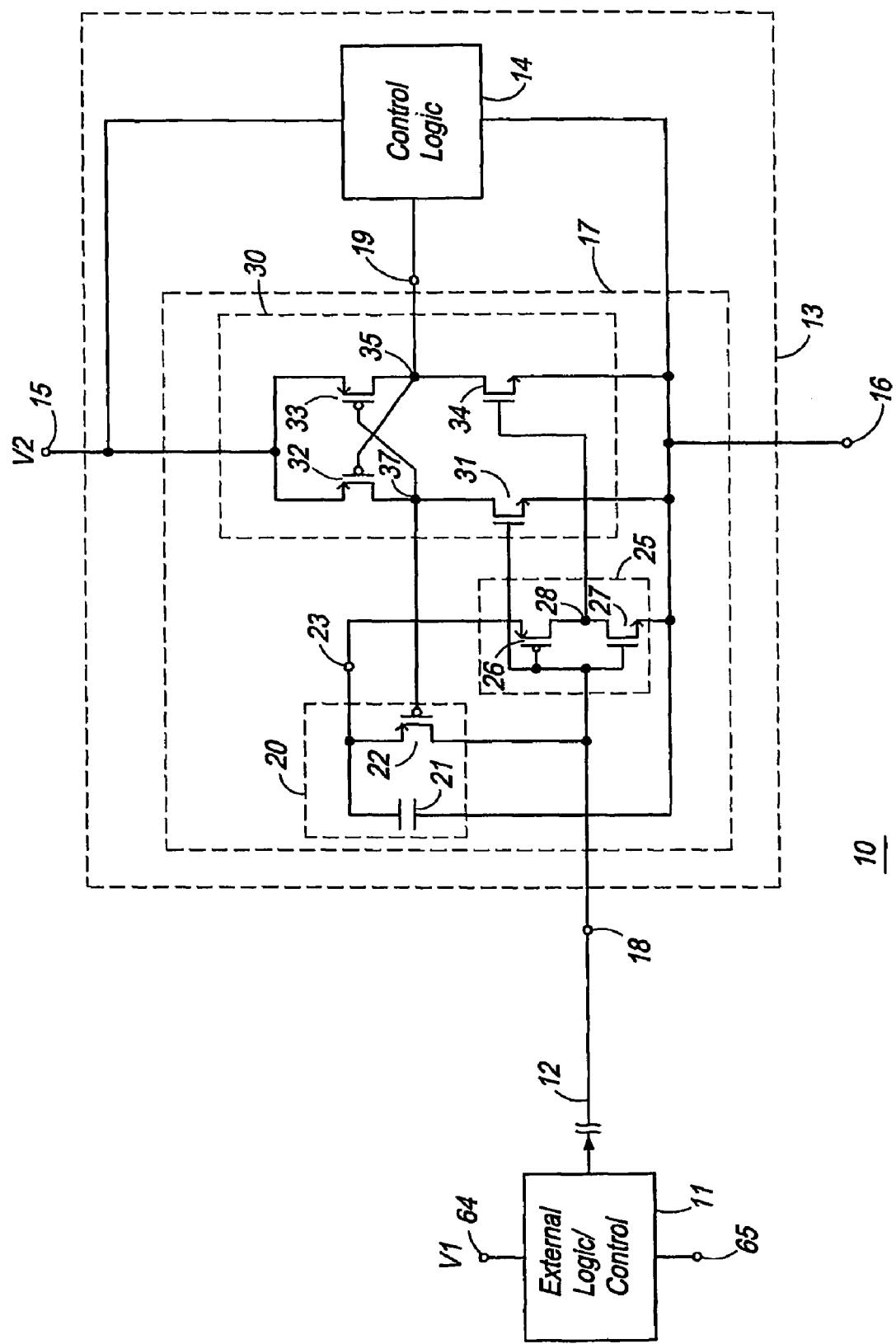
FIG. 1 schematically illustrates an embodiment of a portion of a system that utilizes a signal level translator in accordance with the present invention.

FIG. 1 schematically illustrates an exemplary embodiment of a portion of a system 10 that includes a signal level translator circuit or translator 17 that assists in sending signals between different circuits of system 10. As will be seen further hereinafter, translator 17 receives an input signal that operates between two voltage values, extracts a power supply voltage from the input signal, and uses the extracted power supply voltage to operate a portion of translator 17. The exemplary embodiment of system 10 includes a circuit 11 that operates from a first power supply voltage, such as a voltage V1, that is received between a power input 64 and a power return 65. Circuit 11 usually communicates with a second circuit 13 that operates from a second power supply voltage, such as a voltage V2. Circuit 11 is external to and typically is removed a distance from circuit 13. Circuit 11 may be anyone of a variety of circuits including a combinational logic circuit or a micro-controller that sends a signal to circuit 13 over a communication channel 12. Circuit 13 includes translator 17 which usually receives the input signal from channel 12 on an input 18 and forms an output signal on output 19 that represents the waveform and information of the input signal sent by circuit 11. The output signal on output 19 operates between different voltage levels than the input signal. In addition to translator 17, circuit 13 may also include control logic 14 that receives the output signal from output 19 and uses the output signal for operating logic 14.

Translator 17 and circuit 13 receive power between a power input 15 and a power return 16. Return 16 generally is connected to return 65. The value of the voltage (V2) applied between input 15 and return 16 generally is greater than the value of the power supply voltage (V1) applied to circuit 11 and is greater than the maximum value of the input signal received on input 18. Translator 17 typically includes an input circuit 25, a shifter circuit 30, and a supply circuit 20. Supply circuit 20 forms an internal supply voltage on an output 23 that is utilized for operating input circuit 25. Input circuit 25 is coupled to receive the input signal from input 18 and form a signal on an output node 28 of circuit 25 that is representative of the input signal received on input 18. Supply circuit 20 includes a storage element, such as a capacitor 21, and a control switch, such as a transistor 22, that are utilized to couple the input signal to capacitor 21 when the input signal is at a high voltage value.

Figure 2:
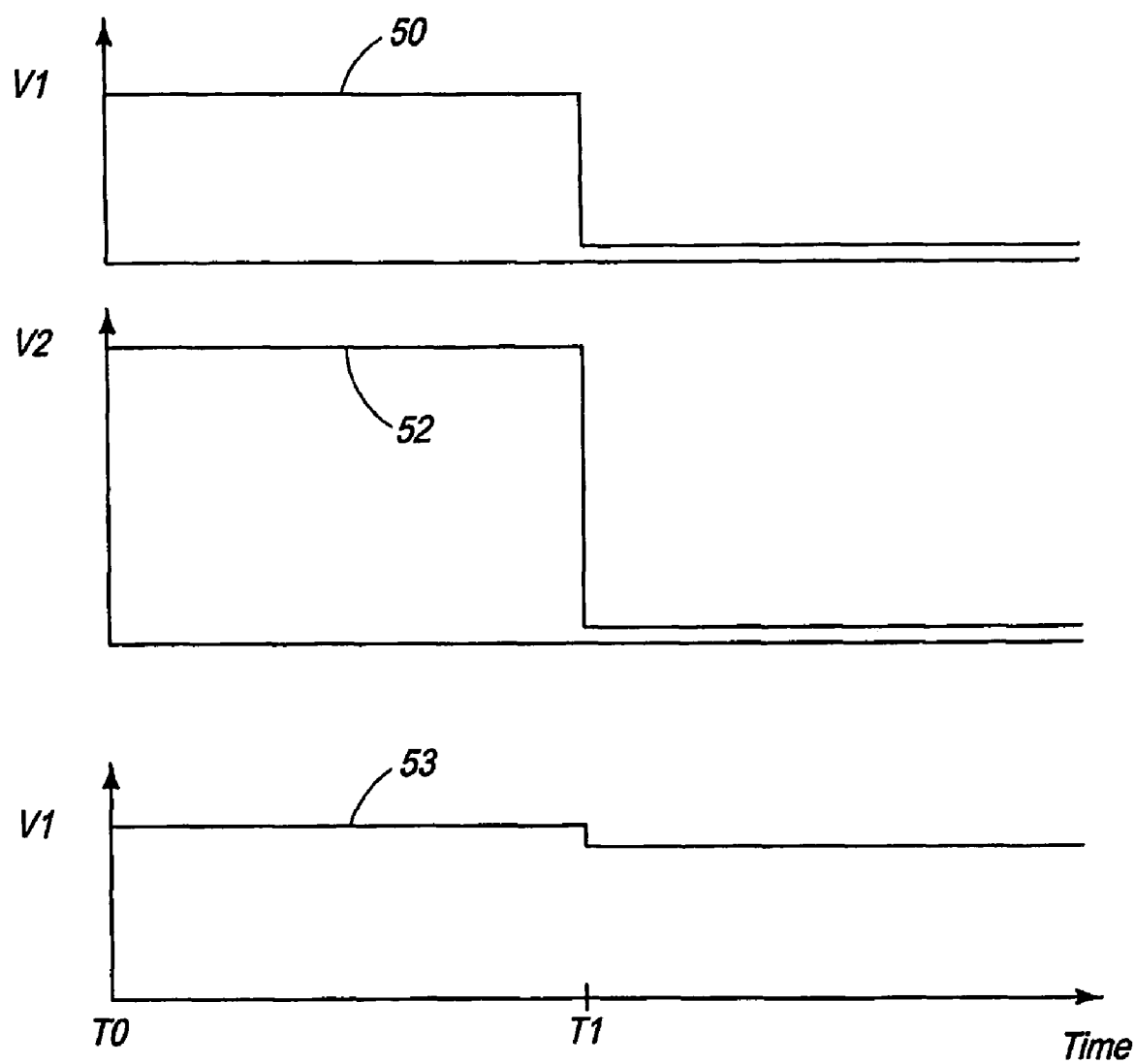
FIG. 2 is a graph having plots of some of the signals of the signal level translator of FIG. 1 in accordance with the present invention.

FIG. 2 is a graph having plots that illustrate some signals during the operation of translator 17. The abscissa indicates time and the ordinate illustrates increasing values of the illustrated signals. A plot 50 illustrates the input signal on input 18, a plot 52 illustrates the output signal on output 19 of translator 17, and a plot 53 illustrates the voltage on output 23 of supply circuit 20. This description has references to FIG. 1 and FIG. 2. Circuit 25 typically is configured as a digital inverter. For such a configuration, the threshold of each of transistors 26 and 27 must be less than the difference between the value of the upper level and lower level of the input signal. Typically, the threshold voltages of transistors 26 and 27 are approximately 0.8 volts, thus, the value of V1 must be at least 0.8 volts and preferably is greater than 1.2 volts to reduce false transitions of output node 28. When the input signal on input 18 is high as illustrated between a time T0 and a time T1, transistor 31 is enabled which pulls node 37 low, substantially to the value of return 16, thereby enabling transistor 22. Enabling transistor 22 couples the input signal from input 18 to one terminal of capacitor 21 thereby charging capacitor 21 to the substantially the value of the input signal (approximately V1). Enabling transistor 22 also couples the input signal to output 23 of circuit 20, thus to circuit 25, so that the voltage level of the input signal is used to power input circuit 25. The high level from the input signal also enables transistor 27 and disables transistor 26 thereby pulling node 28 low. Because transistor 26 is disabled, substantially no dc current is sunk from the input signal, although some leakage current may flow through transistor 26. Those skilled in the art will appreciate that some ac current may flow during transitions when circuit 25 switches from one state to another state. The goal is to configure circuit 20 so that the voltage stored on capacitor 21 is as close as possible to the value of the input signal. Since substantially no dc current flows through transistor 22, the voltage drop across transistor 22 is approximately zero and has substantially no effect on the value of the voltage stored on capacitor. Thus, the voltage stored on capacitor 21 is substantially the value of the high voltage level of the input signal. The low from node 28 disables transistor 34. The low on node 37 also enables transistor 33 which couples the voltage (V2) from input 15 to output 19 and disables transistor 32. Thus, the high level of the input signal responsively forms a high signal on output 19 at the level of the voltage from input 15 (V2) instead of the voltage of the input signal (approximately V1).

When the input signal goes low (approximately to the value of return 16) near a time T1, transistor 31 is disabled. The low input signal also disables transistor 27 and enables transistor 26 to pull node 28 high to the voltage from output 23. The high from node 28 enables transistor 34 to couple node 35 low. The low from node 35 enables transistor 32 thereby pulling node 37 high. Because the value of the voltage on input 15 (V2) is greater than the maximum value of the input signal (approximately V1) and thus greater than the value of the voltage stored on capacitor 21, the voltage on the gate of transistor 22 is greater than the voltage on the source which disables transistor 22. Disabling transistor 22 decouples capacitor 21 from the input signal. However, capacitor 21 is charged substantially to the high voltage level of the input signal when the input signal was at a high voltage (approximately V1) and this voltage that was stored on capacitor 21 is used to operate input circuit 25 while the input signal is low. When transistor 22 is disabled, the value of the voltage from output 23 may slightly decrease as illustrated by plot 53 at time T1. The high from node 37 also disables transistor 33. Thus, supply circuit 20 extracts an internal operating supply voltage from the input signal responsively to a state of the input signal.

In order to facilitate this functionality of translator 17, a gate of transistor 31 is commonly connected to input 18, a gate of transistor 27, a gate of transistor 26, and a drain of transistor 22. A source of transistor 22 is commonly connected to a first terminal of capacitor 21 and output 23 of circuit 20. A second terminal of capacitor 21 is connected to return 16. A source of transistor 26 is connected output 23. A drain of transistor 26 is commonly connected to a drain of transistor 27, and a gate of transistor 34. A source of transistor 34 is commonly connected to a source of transistor 27 and a source of transistor 31. A drain of transistor 34 is commonly connected to output 19, a drain of transistor 33, and a gate of transistor 32. A source of transistor 33 is commonly connected to input 15 and a source of transistor 32. A drain of transistor 32 is commonly connected to a gate of transistor 22, a gate of transistor 33, and a drain of transistor 31 and return 16.

Figure 3:
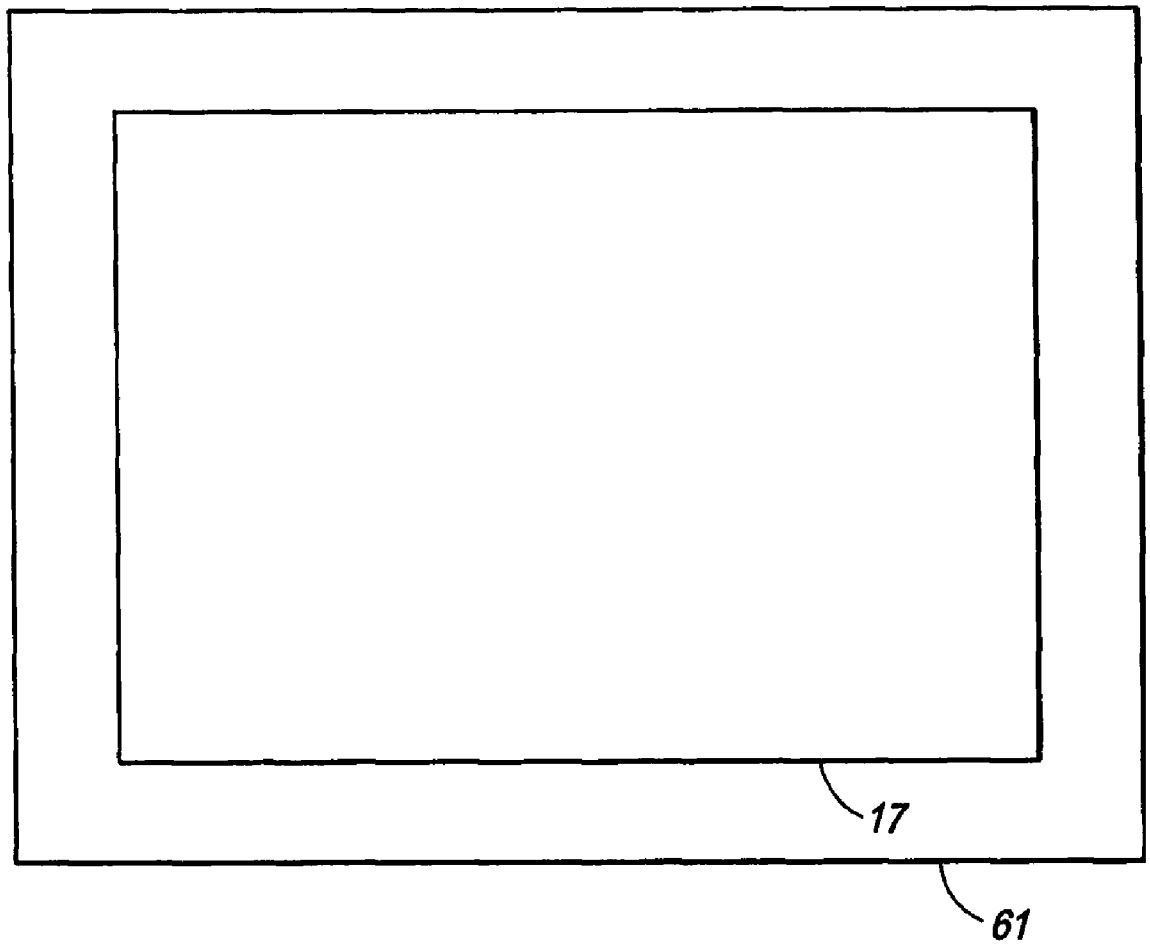
FIG. 3 schematically illustrates an enlarged plan view of a semiconductor device that includes the signal level translator of FIG. 1 in accordance with the present invention.

FIG. 3 schematically illustrates an enlarged plan view of a portion of an embodiment of a semiconductor device or integrated circuit 60 that is formed on a semiconductor die 61. Translator 17 is formed on die 61. Die 61 may also include other circuits that are not shown in FIG. 3 for simplicity of the drawing. Translator 17 and device or integrated circuit 60 are formed on die 61 by semiconductor manufacturing techniques that are well known to those skilled in the art.

In view of all of the above, it is evident that a novel device and method is disclosed. Included, among other features, is forming a signal level translator to receive an input signal that operates between a first and second voltage level, extract a power supply voltage from the input signal, and use the power supply voltage to translate the input signal from the first and second voltage values to third and second voltage values. Configuring circuit 25 as a digital circuit reduces the dc power dissipation of the input circuit and facilitates minimizing power dissipation when no switching occurs such as with a standby mode.

While the subject matter of the invention is described with specific preferred embodiments, it is evident that many alternatives and variations will be apparent to those skilled in the semiconductor arts. For example, input circuit 20 can have other configurations as long as the input circuit operates from the voltage supplied from circuit 20. For example, capacitor 21 may be omitted and the parasitic capacitance of output 23 may be used to store the high value of the input signal. Also, circuit 30 may have other embodiments as long as the other embodiments enable circuit 20 to extract the high level of the input signal. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A signal level translator comprising:

an input circuit configured to operate from a first supply voltage level, the input circuit configured to receive an input signal operating between a substantially the first supply voltage level and a second level and responsively form an output signal wherein the first supply voltage level is greater than the second level; and a supply circuit coupled to receive the input signal and extract the first supply voltage level from the input signal, the supply circuit including a storage element and a first switch configured to couple the input signal to the storage element to store substantially the first supply voltage level on the storage element responsively to the first supply voltage level of the input signal, the first switch further configured to decouple the storage element from the input, signal responsively to the second level of the input signal wherein the storage element supplies operating power to the input circuit responsively to the second level of the input signal.

2. The signal level translator of claim 1 wherein the input circuit includes an inverter coupled to operate from the first supply voltage level and to form the output signal responsively to the input signal.

3. The signal level translator of claim 1 further including a shifter circuit operating from a third supply voltage level that is greater than the first supply voltage level.

4. The signal level translator of claim 3 wherein the shifter circuit is configured to receive the input signal and the output signal of the input circuit and responsively form a translated signal operating between approximately the third supply voltage level and substantially the second level.

5. The signal level translator of claim 1 wherein the supply circuit includes a capacitor having a first terminal coupled to a voltage return of the signal level translator and a second terminal, and a transistor having a first current carrying electrode coupled to receive the input signal, a second current carrying electrode coupled to the second terminal of the capacitor and to an output of the supply circuit, and a control electrode coupled to enable the transistor responsively to the first supply voltage level of the input signal.

6. The signal level translator of claim 1 wherein the input circuit includes a first transistor having a first current carrying electrode coupled to the storage element to receive the first supply voltage level, a second current carrying electrode coupled to an output of the input circuit, and a control electrode coupled to receive the input signal; and a second transistor having a first current carrying electrode coupled to the output of the input circuit, a second current carrying electrode coupled to receive the second level, and a control electrode coupled to receive the input signal.

7. The signal level translator of claim 1 further including a shifter circuit configured to operate from a second supply voltage level that is greater than the first supply voltage level, the shifter circuit having a first input coupled to receive the input signal and a second input coupled to an output of the input circuit.

8. A method of forming a signal level translator comprising:
 configuring a first portion of the signal level translator to operate from a first voltage level and to receive an input signal operating between substantially the first voltage level and a second voltage level wherein the first voltage level is greater than the second voltage level;
 configuring the signal level translator to extract substantially the first voltage level from the input signal and to operate a second portion of the signal level translator from a third voltage level that is greater than the first voltage level; and
 configuring a supply circuit of the signal level translator to selectively store a voltage on a storage element responsively to the first voltage level of the input signal wherein the voltage on the storage element is approximately equal to the first voltage level and configuring the supply circuit to couple the voltage on the storage element to the first portion of the signal level translator as an operating voltage therefor responsively to the second voltage level of the input signal.

9. The method of claim 8 further including configuring the first portion of the signal level translator to receive the input signal and form a first signal operating between approximately the first and second voltage levels.

10. The method of claim 9 wherein configuring the first portion of the signal level translator to receive the input signal and form the first signal includes configuring an inverter to operate from the first voltage level.

11. The method of claim 10 further including coupling a shifter portion of the signal level translator to operate between the third and second voltage levels, to receive the input signal and the first signal, and responsively form an output signal of the signal level translator operating between approximately the third and second voltage levels.

12. The method of claim 11 further including configuring the shifter circuit to form a control signal that is in phase with the input signal and to use the control signal to selectively couple the input signal to the storage element to extract the first voltage level from the input signal.

13. A signal level translator comprising:
 a first transistor having a control electrode coupled to receive an input signal from an input of the signal level translator, a first current carrying electrode coupled to a power return of the signal level translator, and a second current carrying electrode;
 a second transistor having a control electrode coupled to the control electrode of the first transistor, a first current carrying electrode coupled to the second current carrying electrode of the first transistor, and a second current carrying electrode;
 a capacitor having a first terminal coupled to the power return, and a second terminal;
 a third transistor having a first current carrying electrode coupled to receive the input signal, a second current carrying electrode coupled to the second current carrying electrode of the second transistor and to the second terminal of the capacitor, and a control electrode operably coupled to enable the third transistor responsively to the input signal; and
 a fourth transistor having a control electrode coupled to the control electrode of the first transistor, a first current carrying electrode coupled to the power return, and a second current carrying electrode coupled to the control electrode of the third transistor.

14. The signal level translator of claim 13 further including fifth transistor having a first current carrying electrode coupled to the second current carrying electrode of the fourth transistor, a second current carrying electrode coupled to a power input of the signal level translator, and a control electrode.

15. The signal level translator of claim 14 further including a sixth transistor having a control electrode coupled to the second current carrying electrode of the first transistor, a first current carrying electrode coupled to the power return, and a second current carrying electrode coupled to the output of the signal level translator; and a seventh transistor having a control electrode coupled to the control electrode of the third transistor, a first current carrying electrode coupled to the power input and a second current carrying electrode coupled to the output of the signal level translator.

* * * * *